(12) United States Patent
Bogner et al.

(10) Patent No.: US 9,000,809 B2
(45) Date of Patent: Apr. 7, 2015

(54) METHOD AND DEVICE FOR SAMPLING AN INPUT SIGNAL

(75) Inventors: Peter Bogner, Wernberg (AT); Marco Faricelli, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 13/483,242

(22) Filed: May 30, 2012

(65) Prior Publication Data

US 2013/0321053 A1 Dec. 5, 2013

(51) Int. Cl.
*G11C 27/02* (2006.01)
*H03K 5/00* (2006.01)
*H03K 17/00* (2006.01)
*H03M 1/12* (2006.01)

(52) U.S. Cl.
CPC ............... *H03M 1/128* (2013.01); *G11C 27/02* (2013.01); *G11C 27/024* (2013.01)

(58) Field of Classification Search
USPC ................................ 327/91–97; 341/122–125
See application file for complete search history.

(56) References Cited

U.S. PATENT DOCUMENTS

| 6,184,954 | B1 * | 2/2001 | Inoue et al. ..................... 349/86 |
| 6,414,611 | B1 * | 7/2002 | Nagaraj ........................ 341/118 |
| 6,949,951 | B1 * | 9/2005 | Young et al. .................... 326/37 |
| 7,209,061 | B2 * | 4/2007 | Somayajula ................... 341/122 |
| 7,417,482 | B2 * | 8/2008 | Elgebaly et al. .............. 327/278 |
| 7,424,275 | B2 * | 9/2008 | Somayajula ............... 455/114.2 |

OTHER PUBLICATIONS

Carrica D. et al., "Random Sampling Applied to the Measurement of a DC Signal Immersed in Noise", IEEE Translations on Instrumentation and Measurement, vol. 50, No. 5, Oct. 2001, pp. 1319-1323.

* cited by examiner

*Primary Examiner* — Quan Tra

(57) ABSTRACT

In accordance with various embodiments, a method for sampling an input signal may be provided, wherein the method may include providing a single frequency clock signal; selecting clock pulses from the single frequency clock signal in a random manner to generate a spread spectrum clock signal; and sampling the input signal using the spread spectrum clock signal. A corresponding device for sampling an input signal may be provided.

15 Claims, 6 Drawing Sheets

FIG.7
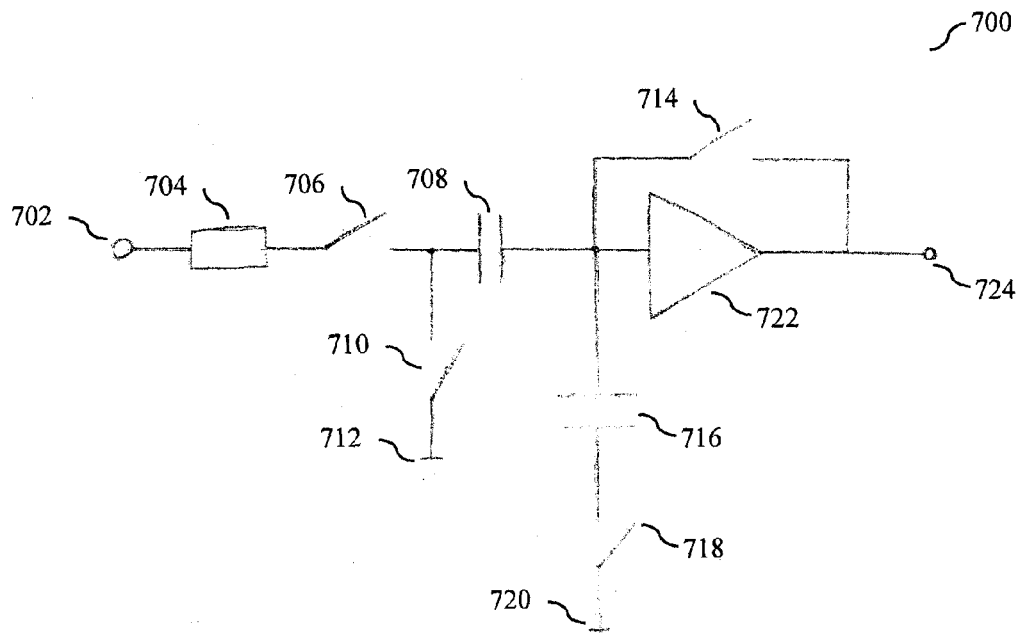
FIG.8A
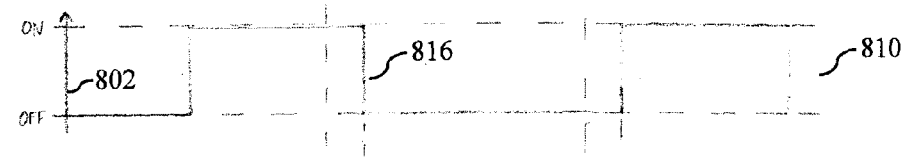
FIG.8B
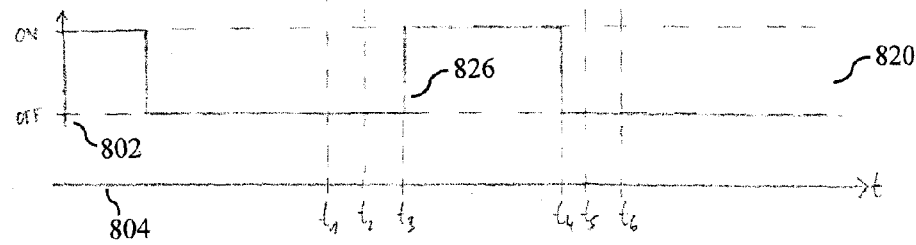
FIG.8C

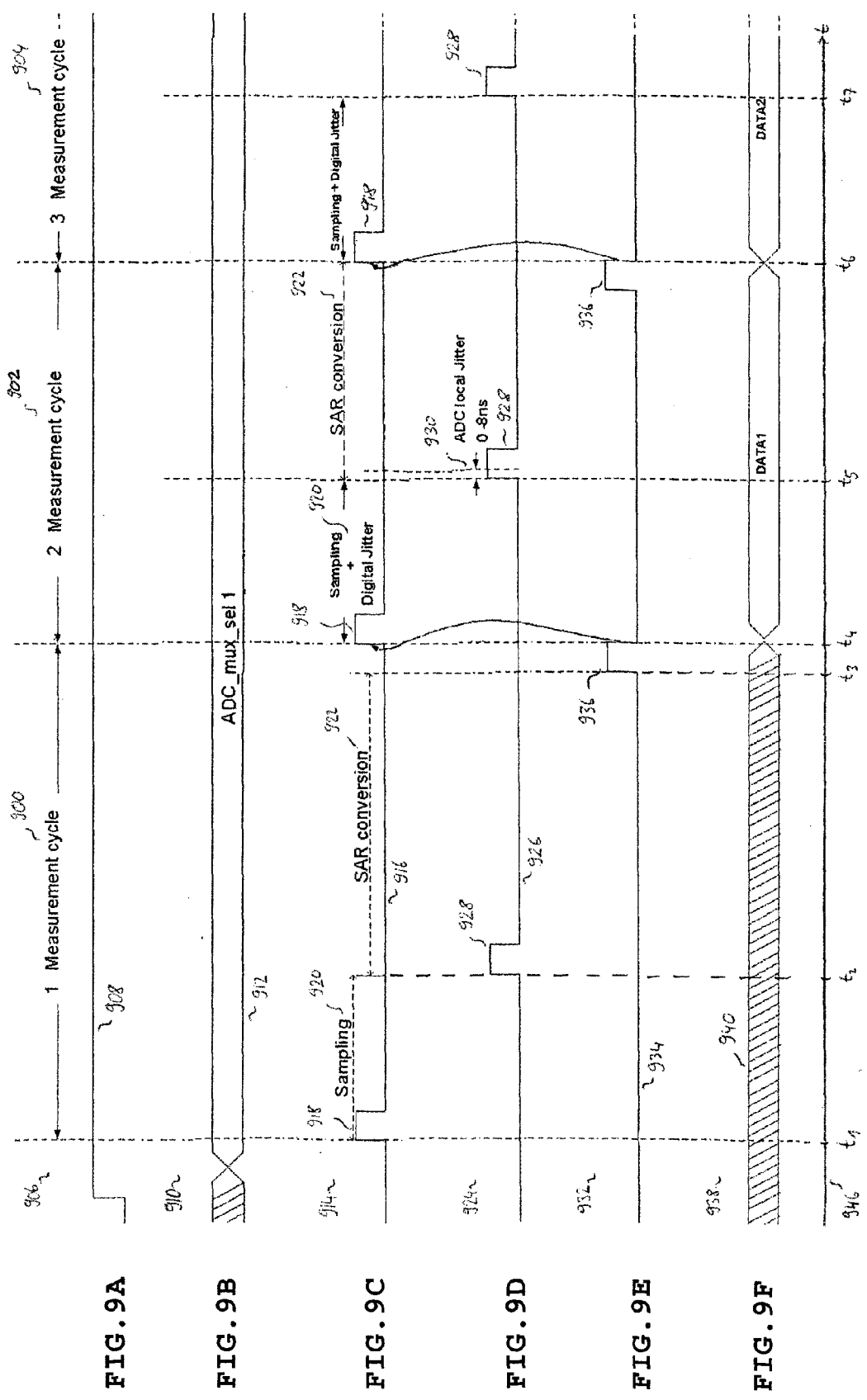

METHOD AND DEVICE FOR SAMPLING AN INPUT SIGNAL

TECHNICAL FIELD

Various embodiments relate to a method and a device for sampling an input signal.

BACKGROUND

With a growing density of electronic components in electronic devices, EMI (electromagnetic interference) robustness is a major specification aspect which needs to be considered during the design of an electronic component, such that the suppression of EMI injection becomes a part of the system to be designed. In automotive products, for example, suppression of EMI is very important, especially in safety related areas where EMI can influence proper operation of electronic systems thereby possibly causing human casualties.

Unfortunately, EMI suppression usually comes at the cost of additional external and internal components. Sometimes, depending on the desired specification or design restrictions of a respective electronic component, it may even be impossible to implement EMI suppression with external components, for example in the case when the integrated circuit is manufactured according to SPT9 (9th generation smart power technology) with a 130 nm manufacturing technology or according to BCDMOS (combined bipolar CMOS (complementary metal-oxide semiconductor) and DMOS (diffused metal-oxide semiconductor) technologies) technology, because the respective external components providing EMI protection are simply too big.

FIG. 1 shows a conventional circuit 100 with a RC filter that is often used to achieve EMI suppression with external components. The RC filter, which includes a resistor 104 and a capacitor 106, is coupled between a circuit input 102 and a microcontroller 108 which may for example include an ADC (analog to digital converter). An input signal applied to the circuit input 102 is thus first low pass filtered before it is fed into the microcontroller 108 via a first input of the microcontroller 108. The other input of the microcontroller 108 is coupled to a reference potential together with one side of the capacitor 106. The capacitance of the filter capacitor 106 is mostly in the range of several nanofarad and the resistance of the filter resistor 104 is on the order of kiloohms such that the corner frequency of the RC filter is typically in the range of several kilohertz. The microcontroller 108 may include a switched capacitor circuit with a capacitance in the range of a few picofarad. The sampling rate of the microcontroller 108 or the ADC which may be included therein may lie in the range of a few hundred kilohertz. The capacitance of the filter capacitor 106 may be chosen big enough such that the switched capacitor included in the microcontroller 108 can be fully charged during every sampling cycle. The signal provided at the circuit input 102 may come from a high voltage circuit manufactured according to the SPT9 or the BCDMOS standard and may lie in the range of 0 V to 60 V. Therefore, the filter resistor 104 and the filter capacitor 106 need to be implemented as high voltage components, i.e. be able to handle voltages in the respective range of the input signal provided at the circuit input 102. The microcontroller 108, on the contrary, may be implemented in CMOS technology and may include low voltage components. One disadvantage of the configuration shown in FIG. 1 may be the set of external components and their relatively large size, due to which an integration of these components directly into the integrated circuit is prevented.

SUMMARY

Various embodiments provide a method and a device which may achieve an on-chip EMI suppression without additional filtering components such as capacitors and resistors. In accordance with various embodiments, a method for sampling an input signal may be provided, wherein the method may include providing a single frequency clock signal; selecting clock pulses from the single frequency clock signal in a random manner to generate a spread spectrum clock signal; and sampling the input signal using the spread spectrum clock signal. A corresponding device for sampling an input signal may be provided.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 7 shows a circuit implementation of the device for sampling input signals according to various embodiments;

FIGS. 8A to 8C show signal sequences during the operation of the circuit shown in FIG. 7;

FIGS. 9A to 9F show various signal sequences of a measurement scheme for sampling input signals according to various embodiments.

DETAILED DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments provide an EMI suppression functionality directly integrated or implemented on an integrated circuit or a chip without external components.

Figure 1:
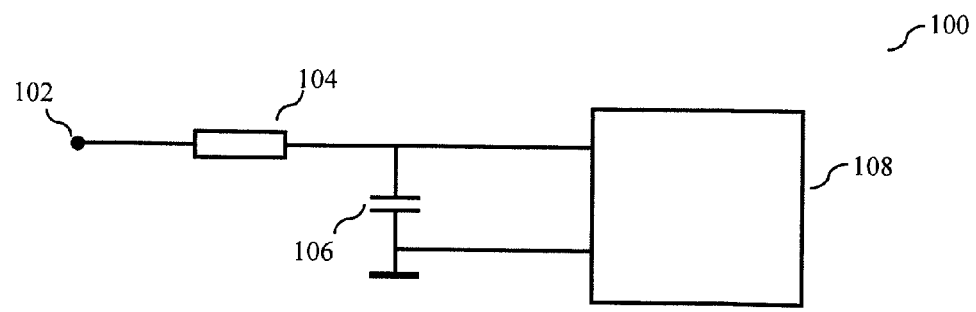
FIG. 1 shows a standard circuit with EMI suppression by means of an RC filter.
Figure 2:
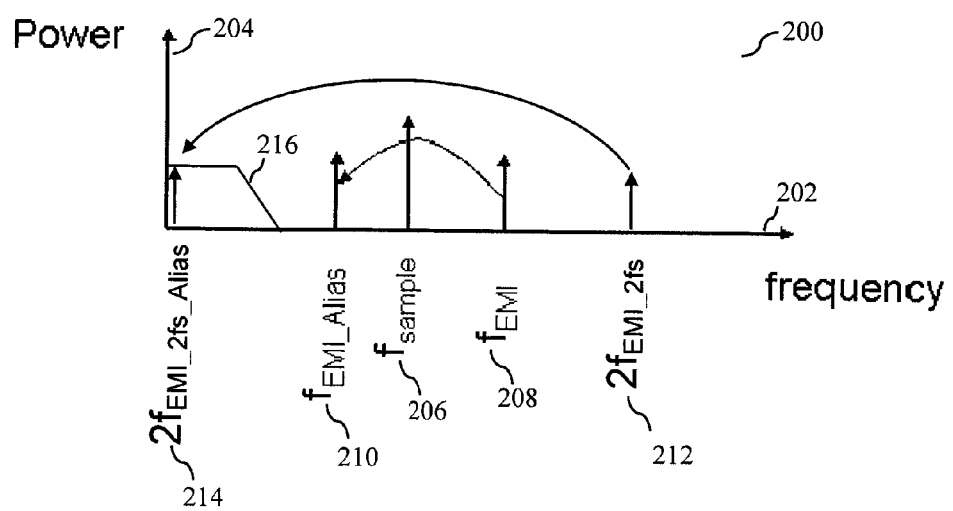
FIG. 2 shows a standard sampling scheme in frequency domain.

In FIG. 2 a diagram 200 representing the sampling scheme of a standard ADC in frequency domain is shown. The description will be focused on switched capacitor ADCs which have an input SH (sample and hold) circuit for providing a sample of an input signal to be converted to the ADC. The description is based on the input signal to be converted which is a DC signal or a near-DC signal, for example an input signal including frequencies up to 1 kilohertz.

In the diagram 200 in FIG. 2 a typical sampling scheme of an analog signal is shown. The x-axis 202 of the diagram 200 denotes a frequency, whereas the y-axis 204 denotes a power. Each of the arrows in the diagram 200 represents a frequency of a signal. A sample frequency 206 shown in the diagram 200 is used to sample an analog input signal. The input SH circuit has the effect of a mixer circuit, i.e. every signal frequency to be sampled which has a frequency around the sampling frequency 206 is folded about the sampling frequency 206 back to lower frequencies within the first Nyquist band. Due to the mixing property of the mixer circuit a disturbance signal such as an EMI signal with an EMI disturbance frequency 208 will also be folded around the sample frequency 206, such that an alias EMI disturbance frequency 210 is present in the first Nyquist band. Since EMI disturbances are undefined and/or random disturbances, EMI disturbance signals with a disturbance frequency of twice the sample frequency 206, as represented by the EMI disturbance signal 212, may be present in the input signal to be converted. As indicated in FIG. 2, such an EMI disturbance signal 212 will be folded into the Nyquist band, its frequency falling to zero, as represented by the alias EMI disturbance signal 214. In such a case, the alias EMI disturbance signal 214 will interfere with the DC or near-DC signal to be sampled and alter its value. Due to the DC or near-DC nature of the back-folded alias EMI disturbance signal 214, it is also able to pass the low pass filter 216 which is usually used to get rid of high frequency EMI disturbance signals.

Figure 3:
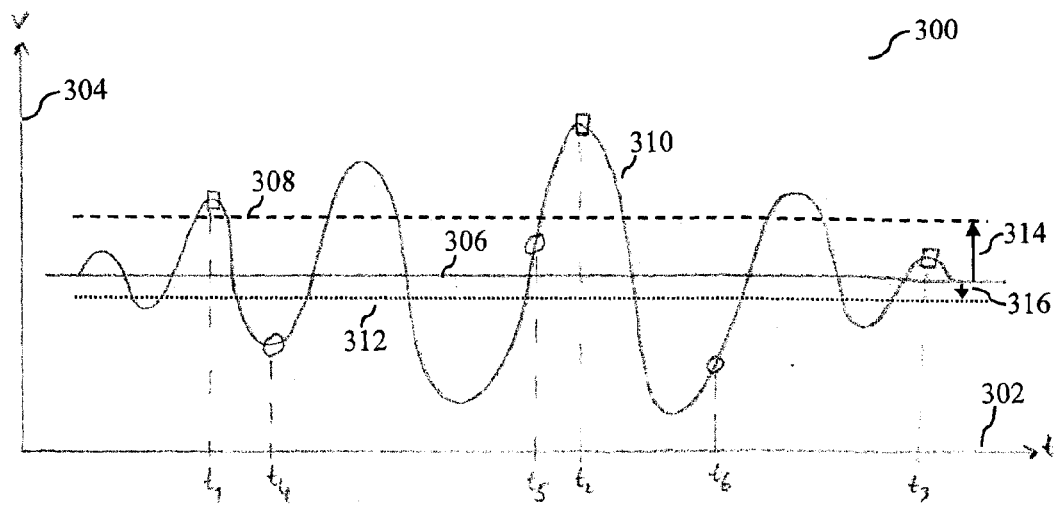
FIG. 3 shows the standard sampling scheme of FIG. 3 and the sampling scheme according to various embodiments in time domain.

The reason for the highly disturbing effect of EMI disturbance signals 212 located at approximately twice or a multiple of the sample frequency 206 is illustrated in diagram 300 of FIG. 3 which illustrates in time domain an undisturbed DC or near-DC input signal 306 to be sampled together and a high frequency EMI disturbance signal 310. The x-axis 302 of diagram 300 denotes a time and the y-axis 304 denotes an amplitude of the signals which may be given in volts. The average disturbed input signal 308 corresponds to an overlay of the undisturbed input signal 306 and the respective values of the EMI disturbance signal 310 at sample points. If the EMI disturbance signal 310 has twice the sample frequency (or has in general a frequency that is a multiple of the sample frequency), each value of the undisturbed input signal 306 that is sampled is altered in the same manner, i.e. either increased or decreased. In the exemplary scenario shown in diagram 300, the sampling events occur at times $t_1$, $t_2$ and $t_3$ at the sampling rate. The sampling events are locked in phase to the EMI disturbance signal 310 and in this example, they coincide with the peaks, i.e. the respective maximum values, of the EMI disturbance signal 310. In other cases, a random phase shift between the sampling events and the disturbance signal 310 may be of course present such that slightly lower values are added to (or subtracted from) the undisturbed input signal 306. However, in any case, the disturbed input signal 308 that is fed into a sample capacitor, for example, corresponds to a falsified undisturbed input signal 306 in the sense that it is offset from the undisturbed input signal 306 by a certain value, wherein the offset may be negative or positive. In the exemplary scenario illustrated in FIG. 3, the disturbed input signal 308 is increased by the offset 314 with respect to the undisturbed input signal 306 at the times $t_1$, $t_2$ and $t_3$. where it is sampled. As a consequence, the digital value of the converted signal does not correspond to the value of the actual undisturbed input signal 306.

According to various embodiments of the method for sampling an input signal, the effect of EMI disturbance frequencies being folded into DC or near-DC frequencies and disrupting proper sampling of DC or near-DC input signals may be mitigated or avoided by using a spread spectrum clock.

The term spread spectrum clock may refer to a clock signal containing multiple frequencies which may be randomly or equidistantly spaced apart within a certain spread spectrum band. However, the spread spectrum clock may also include a continuous distribution of frequencies within the spread spectrum band. In any case, the spread spectrum band may be cantered symmetrically around the single frequency of the single frequency clock signal, i.e. half the spread spectrum may be located at lower frequencies and the other half of the spread spectrum may be located at higher frequencies in frequency space with respect to the frequency of the single frequency clock signal, from which the spread spectrum clock signal may be derived. In the following, the term spread spectrum sample frequency 406 will be used to denote the bandwidth of frequencies included in the spread spectrum sample signal or spread spectrum sample clock, the spread spectrum sample signal being used to sample the DC or near-DC input signal.

Figure 4A:
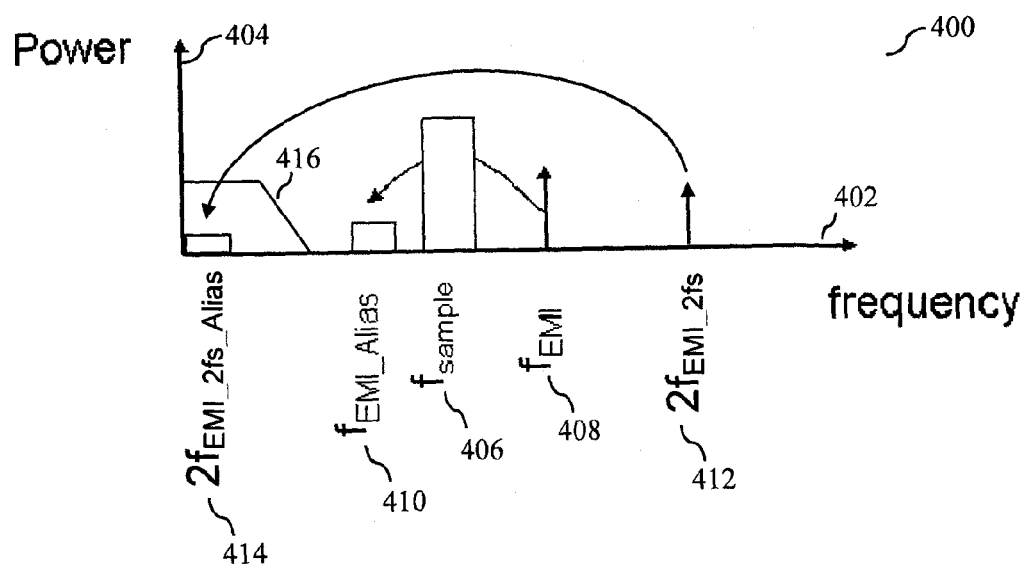
FIGS. 4A to 4C show methods for sampling input signals according to various embodiments
Figure 4B:
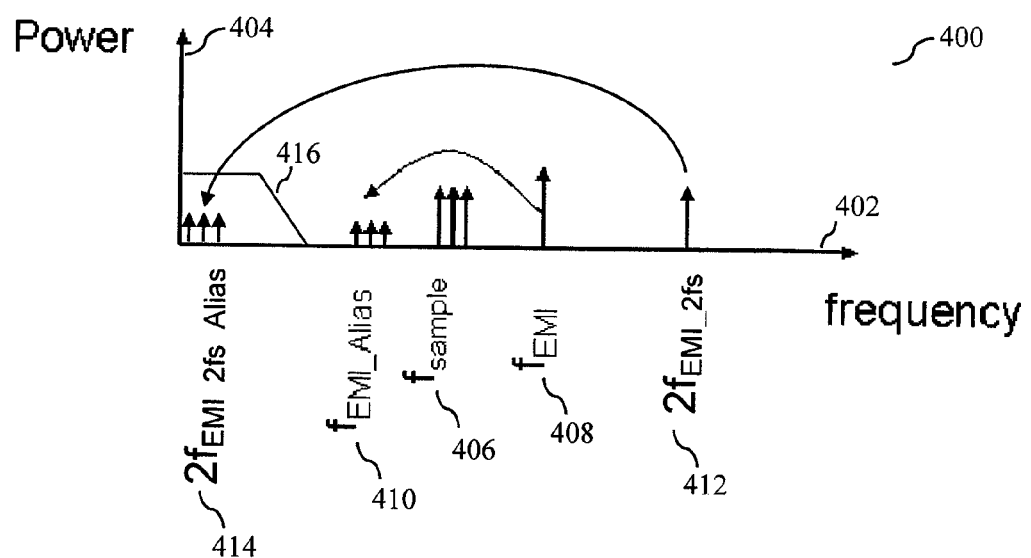
Figure 4C:
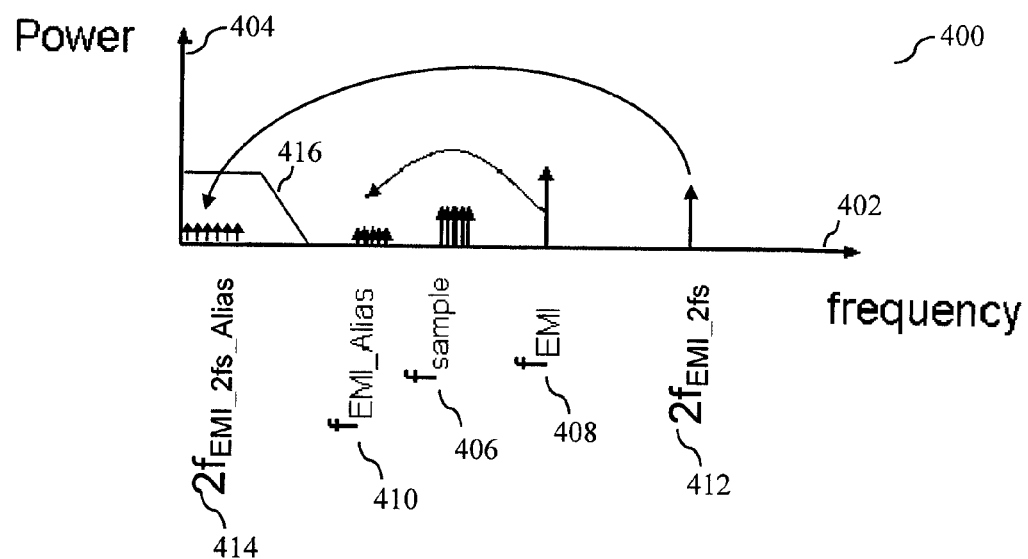

The idea behind the method for sampling an input signal according to various embodiments is illustrated in the diagrams in FIG. 4A through FIG. 4C. A spread spectrum clock may be used to sample the input signal, which may be a DC or a near-DC input signal. The use of a spread spectrum clock results in the power of the single frequency clock signal to be distributed over a certain bandwidth which may include discrete frequency components or a continuous distribution of frequencies. In consequence, when EMI disturbance signals are folded into the first Nyquist band, their power is also distributed over a bandwidth corresponding to the spread spectrum clock signal bandwidth. As the total power of an EMI disturbance signal after being folded into the first Nyquist band and spread over a wider bandwidth remains approximately the same, the amplitude at each component of the (folded) alias EMI disturbance signal is lower than that of the original EMI disturbance signal. This effect may avoid or mitigate problems when EMI disturbance signals are folded to or close to the DC region of the input signal, since their influence may be diminished due to their reduced amplitude. In other words, the method for sampling an input signal according to various embodiments may cause the alias EMI disturbance frequencies that are folded into the first Nyquist band to be distributed over a wider bandwidth such that the disturbing effect at the frequency of the input signal may be greatly diminished.

In diagram 400 of FIG. 4A the effect of the use of a spread spectrum clock signal is illustrated. The x-axis 402 of the diagram 400 denotes a frequency, whereas the y-axis 404 denotes a power. In contrast to the standard sampling scheme which is presented in diagram 200 of FIG. 2, the sample frequency is a spread spectrum sample frequency 406 as it includes a spread spectrum of frequencies which are represented by the rectangle instead of a single arrow. The width of the rectangle represents the bandwidth the spread spectrum sample frequency 406 covers. Due to the mixing property of the input SH circuit, both the first EMI disturbance signal 408 and the second EMI disturbance signal 412, which is located at approximately twice or a multiple of the spread spectrum sample frequency 406, are folded into the Nyquist band. However, the use of the spread spectrum clock signal causes the corresponding alias first and second EMI disturbance signals to be spread over a bandwidth corresponding to the bandwidth of the spread spectrum sample frequency 406. The second alias EMI disturbance signal 414 is still located within the pass band of the low pass filter 416, but the spread of its power over a the bandwidth of the spread spectrum sample frequency 406 may diminish its disturbing effect on the input signal to be sampled.

The corresponding illustration of the advantage of the method for sampling an input signal according to various embodiments in time domain is shown in FIG. 3. As already explained, diagram 300 shows the undisturbed input signal 306 to be sampled together with a high frequency EMI disturbance signal 310 in the time domain. The use of a spread spectrum sample signal to sample the input signal translates into the sampling times, represented by the times $t_3$, $t_4$ and $t_5$, to be distributed in accordance with the different frequencies included in the bandwidth of the spread spectrum sample signal. The sampling times corresponding to the spread spectrum sample signal may therefore cover both negative and positive values of the EMI disturbance signal 310 which in the end results in an smaller or optimized offset 316 of the disturbed input signal 308 from the undisturbed input signal 306 when compared to the case where a single frequency sample signal is used for sampling the input signal (see offset 314 in FIG. 3). In other words, the small optimized offset 316 reflects the sampling of the EMI disturbance signal 310 (which overlays the undisturbed input signal 306) at different, randomly distributed times $t_3$, $t_4$ and $t_5$, which are not distributed equidistantly, such that negative and positive contributions of the EMI disturbance signal 310 are present in the (average) disturbed input signal 308. The average over positive and negative contributions of the EMI disturbance signal 310 is closer to zero thus resulting in a smaller optimized offset 316 when compared with the offset 314 which corresponds to the average value of only positive or only negative contributions of the EMI disturbance signal 310 when a single frequency sample signal is used for sampling the input signal.

In FIG. 4B a further embodiment of the method for sampling an input signal is illustrated. The diagram 400 of FIG. 4B is similar to the diagram 400 of FIG. 4A, therefore the same reference numbers are used for the same elements. In the embodiment shown in diagram 400 of FIG. 4B, the spread spectrum sample signal 406 used for sampling the input signal is implemented digitally which manifests itself in the presence of three distinct frequency components represented by the three arrows. The spread of the single frequency sample signal may be generated by varying the time distance between two successive sampling events of a random number of single frequency clock periods. In this way the sampling events are distributed in a randomly generated whole of events. The spread spectrum sample signal 406 as shown in FIG. 4B may be generated by a pseudo random generator which may trigger different lengths of the sampling time period, i.e. the time period during which the input signal is sampled. Notwithstanding the different nature of the spread spectrum sample signal 406 in FIG. 4B, the achieved effect is the same as the effect achieved by the continuously distributed frequency of the spread spectrum sample signal 406 in FIG. 4A. The first EMI disturbance frequency 408 and the second EMI disturbance frequency 412, which is located at approximately twice the spread spectrum sample signal 406, are folded into the first Nyquist band and correspond to first alias EMI disturbance frequency 410 and second alias EMI disturbance frequency 414, both being spread into multiple frequency components, each having a smaller amplitude than the corresponding EMI disturbance frequency signal.

In FIG. 4C a further embodiment of the method for sampling an input signal is depicted. The diagram 400 of FIG. 4C is similar to the diagram 400 of FIG. 4B, therefore the same reference numbers are used for the same elements. In the embodiment shown in diagram 400 of FIG. 4C, the spread spectrum sample signal 406 used for sampling the input signal is further spread to achieve, in approximation, a wider and denser spread spectrum as compared to the spread spectrum sample signal 406 shown in FIG. 4B. The spread of the spectrum may be obtained by means of a delay chain, which may include multiple inverters arranged in series or a ring oscillator, for example. The delay chain may be used to generate additional random delays between two consecutive clock pulses of a single frequency clock signal from which the spread spectrum sample signal may be derived or generated, as will be explained later on. The delays may thus generate further frequency components within the final spread spectrum sample signal 406 in FIG. 4C as compared with the spread spectrum sample signal 406 in FIG. 4B. In consequence, the second EMI disturbance signal 412 located at approximately twice the spread spectrum sample signal frequency is folded into the first Nyquist band to DC or near-DC frequencies with an even bigger spread. In other words, the power of the second EMI disturbance signal 412 is spread into more components in the alias second EMI disturbance signal 414 such that its interfering or falsifying effect on the DC or near-DC input signal may be reduced. Put in other words, the power of the alias second EMI disturbance signal 414 per digital bin is reduced by its spread or distribution into multiple frequency components stretching over multiple digital bins.

In general, depending on the specific application and the signal to be sampled the bandwidth of the spread spectrum sample signal 406 in the embodiments of the method for sampling an input signal illustrated in FIGS. 4A to 4C may, for example, lie in the range of approximately 500 kHz.

Figure 5:
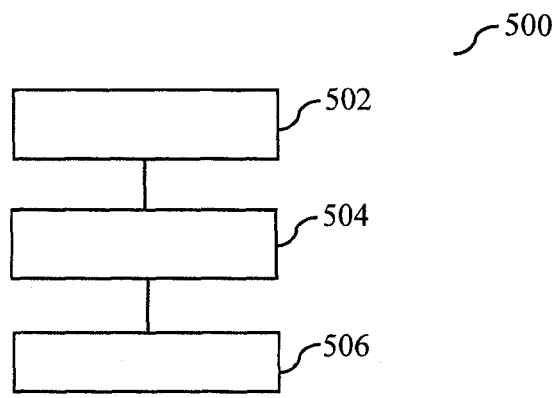
FIG. 5 shows a schematic of a device for sampling an input signal according to various embodiments.

In FIG. 5 an embodiment of a device 500 for sampling an input signal is shown. The device 500 for sampling an input signal may include a selector 502 configured to select clock pulses from a single frequency clock signal in a random manner. The single frequency clock signal may be generated by an external oscillator and be provided to the selector 502 or the selector 502 itself may include a local oscillator from which the single frequency clock signal may originate from. The selector 502 may be coupled to a generator 504 configured to generate a spread spectrum clock signal or spread spectrum sample signal from the selected clock pulses. The generator 504 may be configured to or may include further circuitry modules configured to introduce delays between the selected clock pulses which have been selected by the selector 502. The generator 504 may for example include a delay circuit configured to delay at least one of the clock pulses selected by the selector 502 by a certain delay time. A sampling circuit 506 may be connected to the generator 504 and be configured to sample the input signal using the spread spectrum clock signal which may be provided to it by the generator 504.

Figure 6:
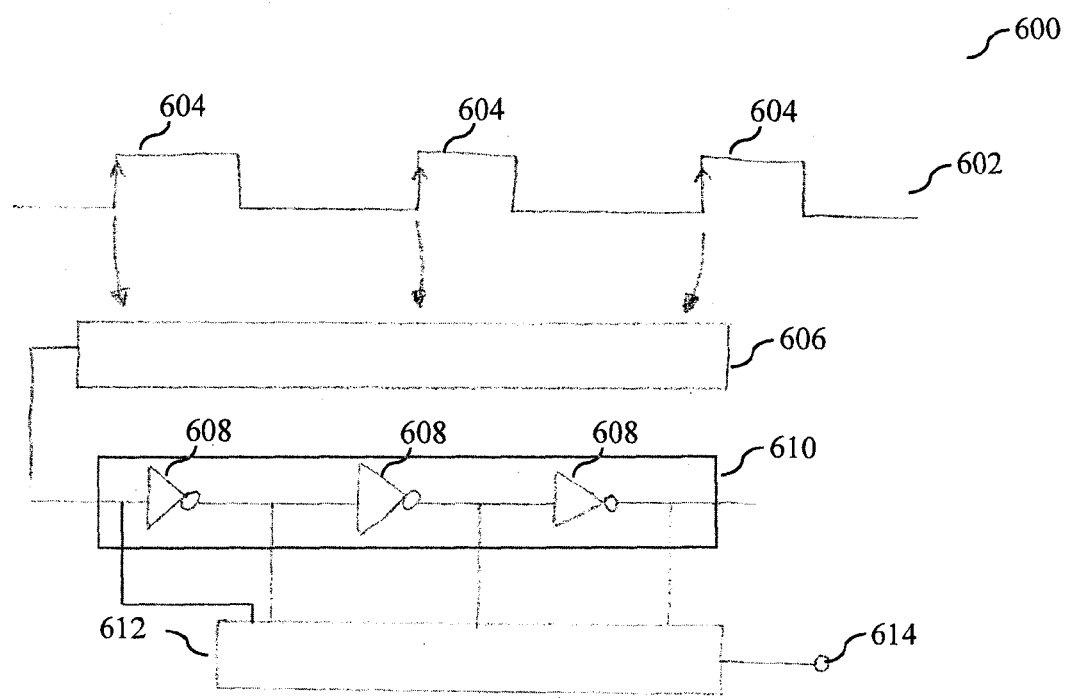
FIG. 6 illustrates the generation of a single frequency clock signal in a device for sampling an input signal according to various embodiments.

In FIG. 6, an exemplary circuit arrangement 600 is shown, which may form a part of the device for sampling an input signal. The circuit arrangement 600 may include a selector 606 which may be configured to select clock pulses 604 from the single frequency clock signal 602. The single frequency clock signal 602 may be a digital signal which may have a frequency of a few tens of megahertz, for example 28 megahertz, which means that in that case the clock pulses 604 are spaced apart in time by approximately 36 nanoseconds. The selector 606, which may be configured as a multiplexer, may be configured to randomly select clock pulses from the single frequency clock signal 602 such that a delay between consecutive clock pulses may be introduced. This delay may be a digital jitter which may be equivalent to a number of clock pulses between 0 and 15 clock pulses, for example the digital jitter may be equivalent to a number of clock pulses between 0 and 7 digital clock pulses. The selector 606 may be configured to introduce a random digital jitter between two selected consecutive clock pulses 604, wherein the digital jitter corresponds to the number of skipped or discarded clock pulses 604 from the single frequency clock signal 602. In the case of a digital jitter of 5 clock pulses, the selector 606 would select a clock pulse 604 and then skip the following 5 clock pulses 604 from the single frequency clock signal 602, such that the two selected clock pulses would be separated by the amount of time which is equivalent to 5 cycles of the single frequency clock signal 602.

The selector 602 may be coupled to a delay circuit 610 which may include a number of inverters 608 coupled in series, for example three inverters 608 coupled in series, as shown in FIG. 6. It is to be pointed out that the delay circuit 610 may be include other means than the inverters 608 for delaying signals. For example, the delay circuit 610 may include capacitive or resistive delay paths, pass gates including transistors which provide signal delay due to their intrinsic delay or a differential pair. The clock pulses 604 selected by the selector 606 may be forwarded to the delay circuit 610. The delay circuit 610 may be coupled to a generator 612 which may be configured to generate a spread spectrum clock signal from the selected clock pulses which it may receive from the delay circuit 610 and provide the spread spectrum clock signal at its output 614. The generator 612 may be configured as a multiplexer and may be further configured to tap the signal before it is input into each of the inverters 608 coupled in series. The generator 612 may include a random or pseudo random generator which may be used to randomly select an input of the generator 612 from which a clock pulse 604 may be used, i.e. included into the spread spectrum clock signal. The amount of inverters 608 preceding a respective node, at which the clock pulse is tapped, adds a certain amount of delay which is equivalent to the sum of signal propagation delays through the number of inverters 608 preceding the said node. In the given example, by random choice of one of its four inputs, the generator 612 may add a delay to every selected clock pulse 604 of up to three propagation delays. The propagation delays through the inverters 608 may be the same or they may be different. This analog jitter, which may be on the order of a few nanoseconds, for example 1 to 10 nanoseconds, for example 1 to 8 nanoseconds or, for example 1 to 5 nanoseconds, may be added independently of the digital jitter which is introduced randomly by the selector 606. Instead of the chain of inverters 608, the delay circuit 610 may be implemented by a ring oscillator, where the bias may be varied, or by any other means which is able to randomly introduced time delays between two consecutive clock pulses 604.

An exemplary embodiment of a sampling circuit 700 is shown in FIG. 7. The sampling circuit 700 includes a an input 702 which is coupled to terminal of a first switch 710 via a resistor 704. The other terminal of the first switch 704 is coupled via a second switch 710 to a first reference potential 712, for example the ground potential, and to an input of a comparator 722 via a first capacitor 708. The input of the comparator 722 is further coupled to a second reference potential 720 via a series arrangement of a second capacitor 716 and a third switch 718 and to the output 724 of the comparator 722 via a fourth switch 714.

An input signal to be sampled, for example a DC or a near-DC voltage signal, may be coupled to the input 702 of the sampling circuit 700. The signal may be in the range of 0 to 60 V, for example in the range of 0 to 40V. The value of the input signal may be sampled and stored by the first capacitor 708 and processed by the comparator 722 and an ADC (analog to digital converter, not shown in FIG. 7) which may be connected to the output 724 of the comparator 722. The first switch 706 may be used to initiate the sampling process, i.e. to load the first capacitor 708 to a value corresponding to the current value of the input signal. The second switch 710 may be used to reset the first capacitor 708 by connecting it with the reference potential 712. The third switch 718 may be used to connect the second capacitor 716 to the input of the comparator 722 in order to provide an offset at the input of the comparator 722 which can be derived from the converted digital value of the input signal. The fourth switch 714, when closed, provides a feedback path between the output 724 of the comparator and its input.

In one embodiment, the resistor may have a resistance of approximately 10 Kiloohm and the first capacitor may have a capacitance of approximately 4 Picofarad. The second reference potential 720 may correspond to a voltage of 1.2 V. The first switch 706 and the second switch 710 may be implemented as high-voltage switches, for example as a DMOS (double diffused metal-oxide semiconductor) transistor as they need to tolerate the input voltage. The third switch 718 and the fourth switch 714 may be implemented as low-voltage switches, for example as thin oxide transistors, as they do not need to tolerate the high input voltage. The term low-voltage may refer to a typical voltage range of CMOS technology, for example 1.5V or 5V. The term high-voltage may refer to the voltage range of the input signal. The first capacitor 708 and the second capacitor 716 may be metal stack capacitors.

The signals applied to the first switch 706, the second switch 710 and the fourth switch 714 may be based on the spread spectrum clock signal which may be provided by the generator 504 in FIG. 5. In FIG. 8A through FIG. 8C the corresponding signals are shown, i.e. in diagram 800 of FIG. 8A a first signal 806 is shown which may be applied to the fourth switch 714, in diagram 810 of FIG. 8B a second signal 816 is shown which may be applied to the first switch 706 and in diagram 820 a third signal 826 is shown which may be applied to the second switch 710. All signals are representations of states such that the y-axis 802 in each of the diagrams carries two values: ON, denoting a conducting position of the respective switch, and OFF, denoting a non-conducting position of the respective switch. The x-axis denotes time and it is shared by all three diagrams.

As can be taken from the three diagrams, the first switch 706 (see diagram 810 in FIG. 8B) and the second switch 710 (see diagram 820 in FIG. 8C) are operated in a mutually exclusive manner, i.e. when one switch is closed, the other one is opened and vice versa. For example, the first switch 706 may be opened at time $t_2$ (closed at time $t_6$) and the second switch 710 may be closed at time $t_3$ (opened at time $t_4$), which do not coincide in order to prevent a short circuit path between the input 702 of the sampling circuit 700 and the reference potential 712. The first signal 806 applied to the fourth switch 714 corresponds to the second signal 816 applied to the first switch 706, wherein a lag which corresponds to the time difference between time $t_1$ and $t_2$ (or $t_5$ and $t_6$) may be introduced for the second signal 816 with respect to the first signal 806. In other words, the first switch 806 is opened and closed together with the fourth switch 714 but lags behind the fourth switch 714 by a certain time difference which in the exemplary switching scheme presented in FIGS. 8A through 8C may correspond to the time difference between the times $t_2$ and $t_1$.

With the device and the method for sampling an input signal according to various embodiments, DC, near-DC or AC input signals may be measured or converted into a digital signal. In one exemplary scenario, the input signal may have a frequency of a few kilohertz and may be sampled at approximately one megasample, wherein each sampled value of the analog input signal may be converted into a digital value with an accuracy of 8 bits. In a further exemplary scenario, the input signal may have a frequency of a few megahertz and may be sampled at approximately one gigasample. In both exemplarily described cases, approximately 1000 samples would be acquired within one cycle of the input signal. Due to the high density of sample points, the input signal may be assumed to be constant for a group of consecutive sample points. In other words, the sampling rate may be adapted to the frequency of the input signal, as the ratio of the sampling rate to the frequency of the input signal may be seen as a relevant system parameter.

One of various possible applications for the device and the method for sampling an input device may be used in automotive and/or safety applications where a parameter such as a voltage needs to be monitored and compared to a threshold value in order to determine whether a certain event or process is to be executed or not. For example, the device and the method for sampling an input device may be used to monitor the supply voltage for an emergency mechanism responsible for the inflation of an airbag of a vehicle in case of an impact. The emergency mechanism inflating the airbag, for example a miniature pyrotechnical device (also called squib) initiating gas pressure generation which may inflate the airbag in case of an accident, may be only triggered if its integrity is guaranteed and if the firing channel supply voltage is in the correct range, which may be indicated by a correct value of the firing channel supply voltage or by the correct value of the squib resistance. Automotive safety regulations may usually require the measurement process to be performed in endless loops. The other significant requirement is, of course, for the determination of the supply voltage and the squib resistance to be precise and robust with respect to disturbances, for example EMI disturbances.

In FIGS. 9A to 9F signal sequences of a measurement scheme for sampling input signals according to various embodiments are shown. The illustrated measurement scheme may be used, for example, to determine the voltage supplied to a squib in an emergency device of a vehicle. All diagrams share the same x-axis 946 which corresponds to a time axis. Three distinct cycles are marked throughout the diagrams for future reference, namely a first measurement cycle 900, a second measurement cycle 902 and a third measurement cycle 904. In diagram 906 of FIG. 9A an ADC enabling signal 908 is shown. The ADC enabling signal 908 has a high value throughout all three measurement cycles which may indicate that the ADC, which for example may be connected to the comparator 722 in FIG. 7, is activated. In diagram 910 of FIG. 9B a multiplexer selection signal 908 is shown which has a constant value throughout all three measurement cycles and indicates that the measurements in FIG. 9A-9F are executed on the same measuring node. The ADC multiplexer selection may be a digital address selecting the node to be measured as the same ADC may be used to measure different nodes. Diagram 914 of FIG. 9C shows an ADC update signal 916. The ADC update signal 916 may be used to initiate a new sampling process, i.e. reset the first capacitor 708 in FIG. 7, for example, and then connect it to the input 702 by closing the first switch 706. The ADC update signal 916 may include pulses 918, a sampling process may be initiated with a rising edge of the ADC update signal pulse 918, for example at time $t_1$. A sampling interval 920 during which the sampling process takes place lasts until a start of conversion signal 926 shown in diagram 924 of FIG. 9D indicates otherwise. The start of conversion signal 926 may include pulses 928 and a rising edge of a pulse 928 may indicate the beginning of the conversion process and therefore the end of the sampling process. Such an event may be observed at time $t_2$ or $t_5$. A rising edge of a start of conversion pulse 928 may mark the beginning of an SAR (successive approximation register) conversion interval 922 (marked in diagram 914 in FIG. 9C) during which the value stored in a sampling capacitor may be converted to a digital value, for example by means of a SAR. However, it is to be pointed out that the SAR architecture used here as an ADC may be replaced by any other means performing analog-to-digital conversion such as a direct-conversion ADC (also referred to as a flash ADC), a ramp-compare ADC, a sigma-delta ADC or a time-interleaved ADC. The end of the SAR conversion interval 922 may be indicated by a rising edge of an end of conversion pulse 936 in an end of conversion signal 934 shown in diagram 932 of FIG. 9E. Such an event may be observed at time $t_3$ or $t_6$ in the first measurement cycle 900 and the second measurement cycle 902, respectively. A falling edge of the end of conversion pulse 936 may coincide with a rising edge of the ADC update signal pulse 918 and initiate the beginning of a next measurement cycle, for example at time $t_4$ between the first measurement cycle 900 and the second measurement cycle 902 or at time $t_6$ between the second measurement cycle 902 and the third measurement cycle 904. When a measurement cycle finishes the end of conversion signal 934 may be asserted in the form of the end of conversion pulse 936, for example towards the end of the first measurement cycle 900 at the time $t_3$. At the beginning of a following measurement cycle, for example at time $t_4$ where the second measurement cycle 902 starts, a data signal 940 shown in diagram 938 of FIG. 9F resulting from the preceding measurement cycle may be provided. The data signal 940 in a respective measurement cycle, for example the second measurement cycle 902, may correspond to the value of the signal which was sampled and converted in the preceding measurement cycle, for example in the first measurement cycle 900. The processes which take place in the second measurement cycle 902 and the third measurement cycle 904 as well as further following measurement cycles are based on the same events as the first measurement cycle 900. The data provided by the ADC for one measurement node are averaged and stored.

The presence of the spread spectrum clock signal in the measurement scheme for sampling an input signals according to various embodiments manifests itself in the variation of the sampling interval 920. The sampling interval 920 may include an offset or digital jitter which may correspond to a number of clock periods from the single frequency clock signal. The number of clock periods from the single frequency clock signal may lie between 0 and 15 clock signals, for example between 0 and 7 clock signals. In other words, the duration of the sampling interval 920 may be varied by adding a random number of clock periods from the single frequency clock signal to it, for example a number of clock signals between 0 and 15 clock signals. The random number of clock signals by which the sampling interval 920 may be extended may be, for example, selected by selected by the selector 606 in FIG. 6. When a 28 MHz single frequency clock signal is chosen, one clock cycle corresponds to roughly 36 nanoseconds and may be seen as a coarse offset. The sampling interval 920 may further include a further offset 930. The further offset 930 may be an analog jitter and correspond, for example, to the offset generated by the delay circuit 610 in FIG. 6. The analog jitter 930 may correspond to a time by which the sampling interval 920 may be extended (independent of the digital jitter) and may correspond to any time ranging from 0 to 10 nanoseconds, for example any time ranging from 0 to 8 nanoseconds. By comparing the time scales on which each of the offsets extends the sampling interval, it may be said that the digital jitter corresponds to a coarse offset whereas the analog jitter 930 corresponds to a fine offset. The prolonging of the duration of the respective sampling interval leads to a variation of the duration of the respective measurement cycle and thus introduces different frequency components, at which the sampling process takes place.

The device and the method for sampling an input signal according to various embodiments may be also used in various other fields and applications. For example, it may be used with an operational amplifier in order to measure the current. In general, both the device and the method for sampling an input signal may be used in fields and/or applications requiring measurements of a DC or near-DC voltage or current, wherein the measurements need to robust with respect to disturbances, i.e. the measurement is required to reproduce the correct value of the input DC or near-DC signals in spite of possible present perturbations or disturbances such as EMI disturbances in the input signal.

The method for sampling an input signal according to various embodiments may enable the manufacture of corresponding devices for sampling an input signal according to various embodiments which, for example, may be manufactured using SPT9 technology or the BCDMOS technology in combination with high voltage components.

The spread spectrum clock signal as presented in this application may be also used to simulate EMI signals which are usually broadband and distributed in a random manner over a certain bandwidth. The spread spectrum clock signal may be coupled to an emitter, such as an appropriately configured antenna, which may then emit electromagnetic waves which then in turn may be used to test the behaviour of electronic devices under EMI influence.

In accordance with various embodiments, a method for sampling an input signal may be provided, wherein the method may include providing a single frequency clock signal; selecting clock pulses from the single frequency clock signal in a random manner to generate a spread spectrum clock signal; and sampling the input signal using the spread spectrum clock signal.

In accordance with another implementation, the single frequency clock signal may be a digital signal.

In accordance with yet another implementation, the method may further include delaying at least one of the selected clock pulses by a delay time.

In accordance with yet another implementation of the method, delaying the at least one of the selected clock pulses may include passing the at least one of the selected clock pulses through at least one delay element. The delay element may for example be an inverter or any other suitable device introducing a delay to signals propagating therethrough.

In accordance with yet another implementation of the method, the input signal may be a DC signal.

In accordance with yet another implementation of the method, the input signal may be an AC signal. The AC input signal may include signal components with frequencies up to several megahertz.

According to further various embodiments, a device for sampling an input signal may be provided, wherein the device may include a selector configured to select clock pulses from a single frequency clock signal in a random manner; a generator configured to generate a spread spectrum clock signal from the selected clock pulses; and a sampling circuit configured to sample the input signal using the spread spectrum clock signal.

According to yet further various embodiments, the device may further include a clock signal generator configured to provide the single frequency clock signal.

In accordance with yet another implementation of the embodiment of the device, the single frequency clock signal may be a digital signal.

In accordance with yet another implementation, the device may further include a delay circuit configured to delay at least one of the clock pulses selected by the selector by a delay time.

In accordance with yet another implementation of the embodiment of the device, the delay circuit may include at least one inverter.

In accordance with yet another implementation of the embodiment of the device, the delay circuit may include a ring oscillator.

In accordance with yet another implementation of the embodiment of the device, the input signal may be a DC signal.

In accordance with yet another implementation of the embodiment of the device, the input signal may be an AC signal. The AC input signal may include signal components with frequencies up to several megahertz.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for sampling an input signal, the method comprising:
    providing a single frequency clock signal;
    randomly selecting at least one clock pulse from the single frequency clock signal;
    delaying at least one of the randomly selected clock pulses by a random delay time to generate a spread spectrum clock signal;
    sampling the input signal using the spread spectrum clock signal.

2. The method of claim 1,
    wherein the single frequency clock signal is a digital signal.

3. The method of claim 1,
    wherein delaying the at least one of the selected clock pulses comprises passing the at least one of the selected clock pulses through at least one delay element.

4. The method of claim 1,
wherein the input signal is a DC signal.

5. The method of claim 1,
wherein the input signal is an AC signal.

6. A device for sampling an input signal, the device comprising:
- a selector configured to randomly select at least one clock pulse from a single frequency clock signal;
- a delay circuit configured to delay the at least one randomly selected clock pulse selected by the selector by a random delay time;
- a generator configured to generate a spread spectrum clock signal from the selected and delayed clock pulses;
- a sampling circuit configured to sample the input signal using the spread spectrum clock signal.

7. The device of claim 6, further comprising:
a clock signal generator configured to provide the single frequency clock signal.

8. The device of claim 7,
wherein the single frequency clock signal is a digital signal.

9. The device of claim 6,
wherein the delay circuit comprises at least one inverter.

10. The device of claim 6,
wherein the input signal is a DC signal.

11. The device of claim 6,
wherein the input signal is an AC signal.

12. The method of claim 1,
wherein randomly selecting the at least one clock pulse from the single frequency clock signal comprises introducing a first jitter in the spread spectrum clock signal; and
wherein delaying at least one of the randomly selected clock pulses by a delay time comprises introducing a second jitter different from the first jitter in the spread spectrum clock signal.

13. The method of claim 1,
wherein randomly selecting the at least one clock pulse from the single frequency clock signal comprises selecting less than all of the clock pulses from the single frequency clock signal.

14. The device of claim 6,
wherein randomly selecting the at least one clock pulse from the single frequency clock signal introduces a first jitter in the spread spectrum clock signal; and
wherein delaying at least one of the randomly selected clock pulses by a delay time introduces a second jitter different from the first jitter in the spread spectrum clock signal.

15. The device of claim 6,
wherein less than all of the clock pulses of the single frequency clock signal are selected.

\* \* \* \* \*